United States Patent [19]

Tenhover et al.

[11] Patent Number: 5,354,615
[45] Date of Patent: Oct. 11, 1994

[54] COATED SIC REINFORCEMENTS AND COMPOSITES CONTAINING SAME

[75] Inventors: Michael A. Tenhover, Solon; Dorothy B. Lukco, Sagamore Hills, both of Ohio

[73] Assignee: The Carborundum Company, Niagara Falls, N.Y.

[21] Appl. No.: 545,328

[22] Filed: Jun. 27, 1990

[51] Int. Cl.$^5$ ............................................. B32B 9/00
[52] U.S. Cl. ................... 428/366; 428/368; 428/387; 428/388
[58] Field of Search ............... 428/366, 367, 368, 387, 428/388

[56] References Cited

U.S. PATENT DOCUMENTS

| | | | |
|---|---|---|---|
| 3,653,851 | 4/1972 | Gruber | 29/183 |
| 3,811,920 | 5/1974 | Galasso et al. | 117/69 |
| 4,315,968 | 2/1982 | Suplinskas et al. | 428/367 |
| 4,340,636 | 7/1982 | DeBolt et al. | 428/215 |
| 4,642,271 | 2/1987 | Rice | 428/698 |
| 4,921,531 | 5/1990 | Nagle et al. | 75/351 |
| 4,961,767 | 10/1990 | Schermerhorn et al. | 65/2 |
| 5,011,514 | 4/1991 | Cho et al. | 51/295 |

OTHER PUBLICATIONS

"Intermetallic Alloys Based on Gamma Titanium Aluminide," JOM article, Jul. 1989, 24–30, Young-Won Kim.

Silicon-Matrix Materials for High Temperature Applications, JOM article, Nov. 1989, 52–55.

*Primary Examiner*—Peter A. Nelson
*Attorney, Agent, or Firm*—Renner, Kenner, Greive, Bobak, Taylor & Weber

[57] ABSTRACT

The subject invention relates to a coated reinforcement material comprising a SiC-based reinforcement having a rare earth boride coating preferably of the general formula:

$$R_xB_{1-x}$$

wherein
R is selected from the group consisting of Y, Sc, Gd, Tb, Dy, Ho, Er and combinations thereof; and
x is from about 0.05 to about 0.66.

The invention further relates to a high strength, high temperature performance composite comprising a SiC-based reinforcement material having a coating comprising a rare earth boride, said coated reinforcement material disposed in a metal matrix material.

39 Claims, 3 Drawing Sheets

COATED SIC REINFORCEMENTS AND COMPOSITES CONTAINING SAME

BACKGROUND OF THE INVENTION

The subject invention relates to reinforcements for high temperature composites that are chemically stable and mechanically stable. In particular, the invention relates to SiC-based reinforcement materials coated with a refractory rare earth boride coating that contributes to the oxidation resistance and high temperature performance of the resulting composite material.

Traditionally many commercial applications of high temperature materials have been filled by Ni-, Co-, and Fe-based metal alloys. These materials function well at temperatures below about 800° C., but rapidly lose strength upon exposure to higher temperatures. Thus, in the field of high temperature materials, researchers have focused on the use of heat resistant fibers to reinforce both metallic and ceramic materials. These high strength composites possess a unique combination of high strength, temperature stability, and low density. This allows for their use in materials for aerospace, automotive, and industrial applications.

Silicon-containing materials are known reinforcements for composite materials. These composites potentially possess high toughness levels and good performance characteristics, thereby making them highly suitable for applications which require light-weight structural materials having high elasticity, high strength, shapability, heat stability, electrical conductivity and heat conductivity. These composites are being increasingly investigated for structural applications.

It is known that many fiber-matrix combinations undergo extensive chemical reaction or interdiffusion between the fiber and matrix materials, each of which is likely chosen for the contribution of specific mechanical and/or physical properties to the resulting composite. Such reaction or interdiffusion can lead to serious degradation in strength, toughness, ductility, temperature stability and oxidation resistance. Some changes may result from the difference in the thermal expansion coefficients of the materials.

To compensate for these problems, a variety of coatings have been suggested for reinforcements intended for use in fiber-matrix composites. For example, U.S. Pat. No. 4,340,636 discloses a surface treatment for the formation of a carbon-rich coating on a stoichiometric SiC substrate filament. Similarly, U.S. Pat. No. 4,315,968 discloses coating SiC filaments with a coating of Si-rich SiC.

U.S. Pat. No. 3,811,920 discusses applying a thin layer of TiC to a filamentary substrate having a SiC surface layer. This TiC layer is reported to impart oxidation resistance to the filament and to provide a diffusion barrier between the SiC-surfaced substrate filament and the matrix metals. Boron nitride has also been used as a SiC coating, as in U.S. Pat. No. 4,642,271.

Intermetallic matrix materials have experienced problems similar to those enumerated hereinabove when combined with reinforcements to produce high performance composites. The problems being experienced in this technology field are generally a result of the fact that the matrix material technology and fiber technology have evolved independent of one another, resulting in chemical and mechanical incompatibility of the precursor materials used to produce composites of the type disclosed hereinabove. The foregoing citations demonstrate various attempts within the field to overcome the inherent shortcomings of these composites by using coating materials to provide the needed characteristics or compatibility.

However, composite materials which have employed techniques and coatings such as the foregoing nonetheless remain limited for high temperature application by concerns regarding the thermomechanical stability, thermochemical stability, oxidation resistance and high temperature fatigue resistance encountered in atmospheric conditions at temperatures above 800° C. A specific problem encountered with a number of these coatings relates to the chemical reactivity of the coating with the matrix materials, which manifests itself in the failure of the mechanical and physical performance of the material in high temperature environments.

Accordingly, an object of the subject invention is to provide a coating for SiC-based reinforcements which permits the use of the reinforcement in composite materials for use at high temperatures above 800° C.

Another object of the invention is to provide a coating for SiC-based reinforcements which prevents chemical reaction between the fiber and the matrix in composite materials.

A further object is to provide a metal matrix composite which contains coated SiC-based reinforcements which maintains high strength and toughness and resists oxidation at high temperatures.

SUMMARY OF THE INVENTION

The subject invention relates to a coated reinforcement material comprising a SiC-based reinforcement having a rare earth boride coating, preferably of the general formula:

$$R_xB_{1-x}$$

wherein
R is selected from the group consisting of Y, Sc, Gd, Tb, Dy, Ho, Er and combinations thereof; and
x is from about 0.05 to about 0.66.

The invention further relates to a high strength, high temperature performance composite comprising a SiC-based reinforcement material having a coating comprising a rare earth boride, said coated reinforcement material being disposed in a metal matrix material.

DETAILED DESCRIPTION OF THE INVENTION

The subject invention relates to coated SiC-based reinforcements for use in composite materials. The coatings disclosed herein are of the general formula:

$$R_xB_{1-x}$$

wherein R is selected from the group consisting of Y, Sc, Gd, Tb, Dy, Ho, Er and combinations thereof, and x is from about 0.05 to about 0.66. Optionally, depending on the matrix composition, the coating may contain from trace amounts up to about 20 atomic percent of Si and Al. Further, from trace amounts up to 10 atomic percent of N, O and C may be found in the coating as impurities.

The subject coating is of importance due to its compatibility with not only the reinforcement to be coated, but also the matrix material with which the coated reinforcement is combined to form a composite. The coating further effectively inhibits diffusion of Si and C, and forms smooth, adherent coatings on SiC-based reinforcements. Because of these characteristics, the resulting composite is capable of maintaining its strength and high temperature performance at temperatures exceeding 800° C. for extended periods of time, thus making the composite highly suitable for demanding industrial applications.

The coating, as described herein, can be deposited by any known conventional thick or thin film physical, chemical or plasma-assisted deposition processes, examples of which include but are not limited to chemical vapor deposition, rf sputtering, reactive sputtering, reactive ion plating, and reactive evaporation. The coating should be deposited in a layer that is from about 0.2 microns to about 5 microns thick, preferably between about 0.5 micron to about 2.0 microns. Optimally, the reinforcement should be completely coated. Minimal areas that remain uncoated will not, however, adversely affect the composite performance due to the localized nature of the reaction sites which would exist in such minimal uncoated areas.

The SiC-based reinforcement may be selected from SiC and SiC-based fibers, many of which are readily available commercial items such as Sigma Fibers from British Petroleum, SCS-6 from Textron, and Nicalon Fibers from Dow Corning. This reinforcement material should be in the form of continuous fibers.

Figure 1:
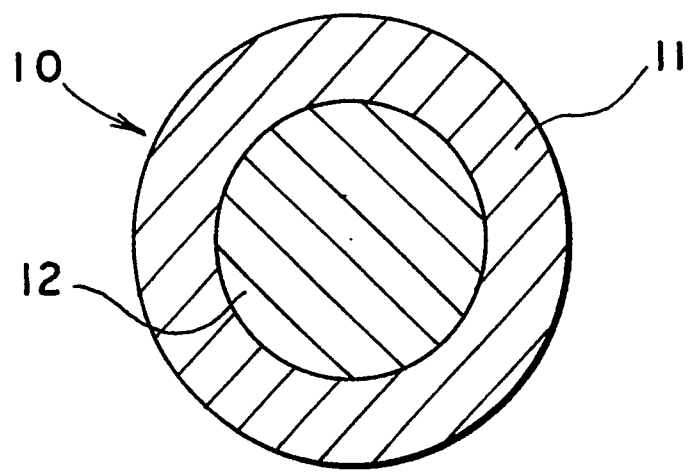
FIG. 1 represents a cross-section of a coated SiC-based reinforcement fiber.

FIG. 1 is a cross-section of a coated reinforcement 10 wherein a SiC-based reinforcement fiber 12 has been coated with a rare earth boride coating 11 as described herein.

The reinforcement material may further be amorphous, polycrystalline or single crystal in nature. An appropriate reinforcement for a given application may be selected from those specified above depending on the optimum characteristics to be attained in the resulting composite, such as strength-per-weight, smoothness, high temperature performance, or toughness, among others.

It may be advantageous, depending on the end use of the material, to form the reinforcement by depositing a SiC-based material listed above on a core material which possesses a very high melting point prior to deposition of the subject coating. Such core material would typically be carbon or a refractory metal, such as W, Mo or Ti, among others, each of which is commercially available, such as those available from Stackpole Fibers Company and Alfa Inorganics.

Figure 2:
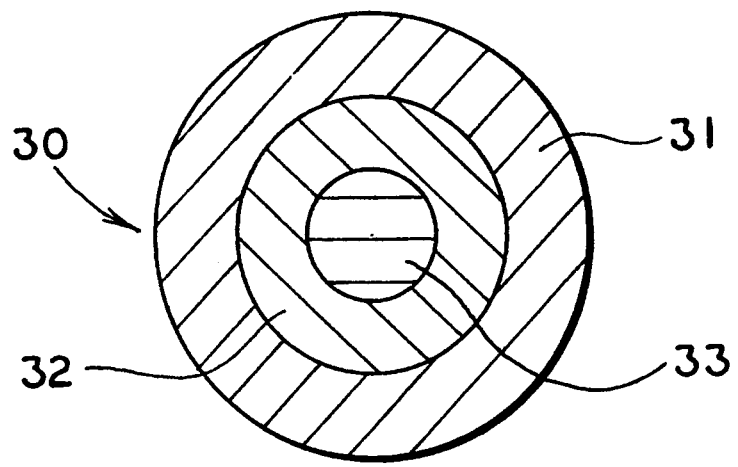
FIG. 2 represents a cross-section of a coated SiC-based reinforcement which was first deposited on a core material.

FIG. 2 is a cross-section of a coated reinforcement 30 having a core 33, deposited with a SiC-based material layer 32, which is then coated with a rare earth boride coating 31 of the type disclosed herein.

Prior to coating any of the reinforcements described above, the reinforcement may be pretreated to enhance the adherence of the coating to the reinforcement and the smoothness of the reinforcement-coating interface. Such pretreatment processes may include chemical etching, ion etching, flame polishing and mechanical polishing, among others, which may be accomplished by conventional pretreatment techniques.

The coated reinforcement may be fabricated into various shapes or may be woven or otherwise structured prior to combination with the matrix material. This fabrication may also be accomplished according to conventional techniques.

For use in complex-shaped components, it is desirable to fabricate the reinforcements into a shape prior to the application of the coating. This can be accomplished for example, by weaving continuous fibers into a three-dimensional shape. However the fabricated shape is prepared, it is important that the shape not be fully dense and preferably that it be about 10–50% dense with no closed porosity. Coating of the reinforcements in the fabricated shape is preferably accomplished by chemical vapor deposition.

Suitable matrix materials into which reinforcements coated according to this disclosure are to be disposed are intermetallic and metallic matrix materials. Generally, matrix materials include: intermetallic alloys containing at least two of Ti, Al, Nb, Ta, Cr, V, and Si, and a metal or alloy containing at least one of Al, Si, Mg, Ni, Ti, Zr, Nb, Ta, Li, V, Sn, Mo, Cr and Mn. Table I below lists a number of representative matrix materials suitable for use in the subject invention, though the list is not intended to be exhaustive of all possible matrix materials.

TABLE I

Potential matrix materials

Intermetallics:

| | | |
|---|---|---|
| $Ti_3Al$ | $TiAl$ | $TiAl_3$ |
| $Nb_3Al$ | $NbAl$ | $NbAl_3$ |
| $Zr_3Al$ | $ZrAl$ | $ZrAl_3$ |
| $Ta_3Al$ | $TaAl$ | $TaAl_3$ |
| $Ni_3Al$ | $NiAl$ | $Ni_3AlB_{0.01}$ |
| $Fe_3Al$ | $FeAl$ | $Fe_3AlB_{0.01}$ |
| $Ti_5Si_3$ | $Zr_5Si_3$ | $Al_{67}Ni_8Ti_{25}$ |
| $Ti_{44}Nb_{11}Al_{45}$ | $Ti_{65}V_{10}Al_{25}$ | $Ni_2AlTi$ |
| $TiTaAl_{0.8}Cr_{0.1}V_{0.1}$ | $TiNbAl_{0.7}V_{0.1}Si_{0.3}$ | $MoSi_2$ |
| $TiTaAl_2$ | $Ti_{65}Al_{24}Nb_{11}$ | |

Metals:

| | |
|---|---|
| Ti | Ti—6Al—4V |
| Zr | Ti—15V—3Al—3Cr—3Sn |
| Nb | Ti—6Al—4V—1Mo |
| Ta | |

For intermetallics, especially interesting are the Titanium-Aluminide alloys described in a JOM article from July 1989, pages 24–30 by Young-Won Kim entitled, "Intermetallic Alloys based on Gamma Titanium Aluminide", and also the Silicide alloys described in JOM November 1989 pages 52–55 by Peter J. Meschter and Daniel S. Schwartz entitled "Silicide-Matrix materials for High Temperature Applications." Preferred matrix materials include metallic alloys such as Ti-6Al-4V and Ti-15V-3Al-3Cr-3Sn; and intermetallic alloys such as $Ti_3Al$, $TiAl$, $TiAl_3$, $Ti_{65}Al_{24}Nb_{11}$, $Ti_{44}Nb_{11}Al_{45}$, Ti-TaAl$_2$, $Ni_3Al$, FeAl and $NbAl_3$, and similar Ti-, Zr-, Nb-, and Ta-containing alloys. Preferably, the coating specified herein may contain up to 20 atomic percent Si and/or Al when the matrix contains Si and/or Al, which further enhances the thermal stability of the finished composite.

The coating specified above as $R_xB_{1-x}$ may further contain Si and Al such that the general formula becomes:

$$R_xB_{1-x-y}M_y$$

wherein M is at least one of Si and Al, and wherein x is present from about 0.5 to about 0.66 and y is up to about 0.2. Further, the coating may contain N, O, or C up to 10 atomic percent of the coating as impurities.

Matrix materials may be obtained commercially in the form of powders or foils, such as TiAl powder or foil, or may be formulated by arc melting, casting, hot pressing or other known techniques.

When preparing coated reinforcements by sputtering, the target may be a solid piece of the coating material, such as $Y_{0.34}B_{0.66}$ available commercially from Cerac Inc., or may be a mixture of the components of the coating, such as metallic Y and B. An inert gas, such as argon, will be present as the sputter gas. The total pressure of the sputter gas should be less than about 50 mtorr. The temperature during the deposition process may be anywhere from room temperature to about 1000° C. The deposition rate may vary from 1 to about 1000 angstroms/second. The resulting coating should preferably be between about 0.2 microns and about 5 microns thick, and have a density of at least about 80% and most preferably greater than 95%.

The efficiency of the diffusion barrier properties of the coating are related to the density of the coating, i.e. density in excess of about 80% corresponds to minimal or no diffusion of elements from the reinforcement to the matrix.

A similar coated reinforcement can be prepared by chemical vapor deposition by using rare earth and boron halogen, or organometallic compounds in the presence of hydrogen or hydrogen-inert gas mixtures. The temperature range for such a process is between about 400° C. and about 1000° C. Use of an rf or dc plasma to aid in the deposition process may be necessary.

The coated reinforcement may be combined with a selected matrix material by any of a number of methods and techniques known to those skilled in the art, such as hot pressing or melt infiltration, among others. Such process should be conducted under vaccuum or in an inert atmosphere, such as in the presence of argon.

Composites, such as those containing rare earth boride coated SiC fibers, are operable in an environment wherein the temperature is up to about 90% of the melting point of the matrix material. Further, such composites are operable at pressures from 0 to about 100 atms., and can be used in air, vacuum or inert atmospheres, such as Ar, $N_2$ or He.

EXAMPLES

The following experimentation was conducted to demonstrate the stability of coated SiC-based reinforcements at elevated temperatures.

The samples prepared and tested in the following examples were of the structure:

matrix/coating/substrate

Substrate, for purposes of these examples, refers to a finely polished bar of sintered SiC (Alpha SiC sintered with boron sintering aid) which was used as a base upon which to build the composite structure. The coating and matrix layers were applied to the substrate using magnetron sputtering and a commercial S-gun arrangement. A typical procedure was to mount the polished SiC substrate in a cryopumped (base pressure $2 \times 10^7$ torr) vacuum chamber on a sample holder that rotated about the sputter gun to insure an even coverage of the coating. One S-gun was used to deposit the coating layer of 0.2 to 0.5 microns while the matrix of 0.5 to 1.0 microns could be deposited using the other S-gun, thus avoiding the need to break the vacuum between the deposition of the two layers. The sputtering was performed in an argon atmosphere, at a pressure of 1.5 mtorr.

The foregoing process produced smooth, dense, adherent coatings. The thickness of the coating and matrix were determined by a TM-100 thickness monitor in the vacuum chamber.

Following deposition, the samples were tested by exposure to a vacuum anneal for 4–12 hours at 1000° C. This was performed in a high vacuum chamber (cryopump $5 \times 10^7$ torr) using a temperature controlled resistance heated Radak furnace.

The following table, Table II, reports the extent of reaction for various samples prepared as described hereinabove. As can be seen, those samples in which the SiC reinforcement was coated with an $R_xB_{1-x}$ coating according to the subject invention (F, G and H), experienced no reaction compared to the remaining samples which did not contain the $R_xB_{1-x}$ coating of the SiC, but rather contained different coatings (A-E). Also shown in Table II is the result of testing uncoated SiC in a Ti-6Al-4V matrix.

TABLE II

| Sample | Matrix | Coating | Result |
|---|---|---|---|
| A | Ti—6Al—4V | $Ti_5Si_3$ | Extensive reaction |
| B | Ti—6Al—4V | $TiB_2$ | Extensive reaction |
| C | $Ti_{56}Al_{44}$ | BN | Reacted |
| D | $Ti_{56}Al_{44}$ | Si | Reacted |
| E | $Ti_{56}Al_{44}$ | SiC | Reacted |
| F | Ti—6Al—4V | $Y_{0.35}B_{0.65}$ | Stable interface |
| G | $Ti_3Al$ | $Y_{0.35}B_{0.65}$ | Stable interface |
| H | Ti | $Y_{0.11}B_{0.89}$ | Stable interface |
| I | Ti—6Al—4V | None | Extensive reaction |

X-ray Photoemission Spectroscopy (XPS) was used to determine the extent of reaction between the reinforcement and the matrix.

The XPS spectra were acquired on a PHI 5400 XPS instrument using 300 watt Mg $K_\alpha$x-rays, 1 mm diameter spot size, and 35.75 pass energy. Survey spectra were taken so that all surface components could be identified and higher resolution narrow region scans could then be obtained. The pressure in the main analysis chamber was in the $10^{10}$ torr.

Figure 3A:
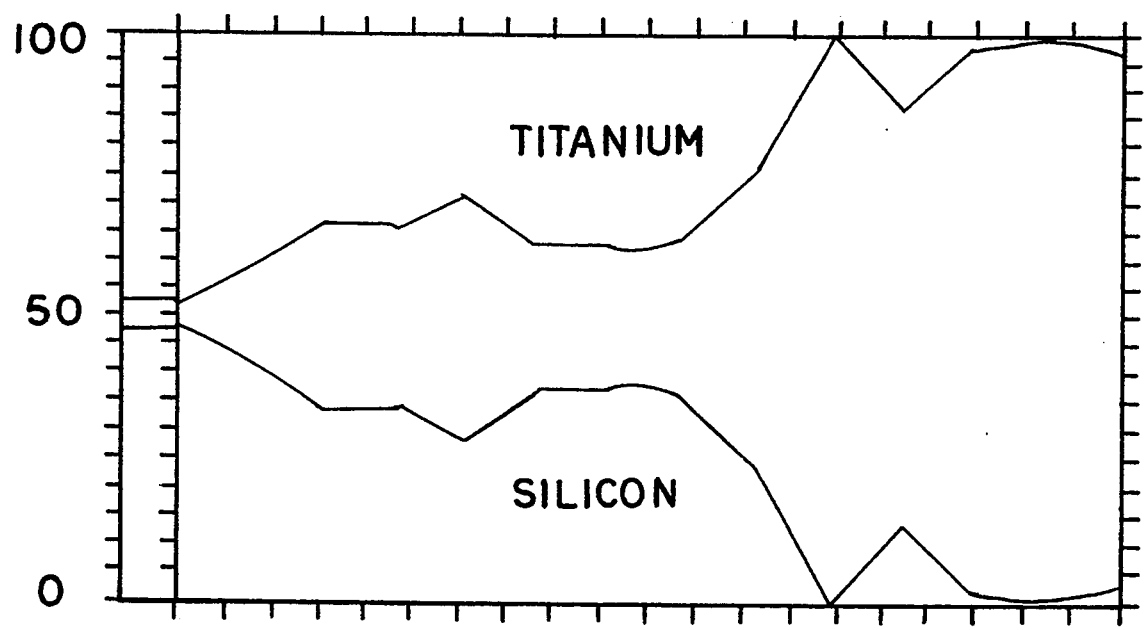
FIG. 3a and 3b are XPS depth profiles for a SiC reinforcement coated with $Ti_5Si_3$ (a) before and (b) after heat treatment at 800° C.
Figure 3B:
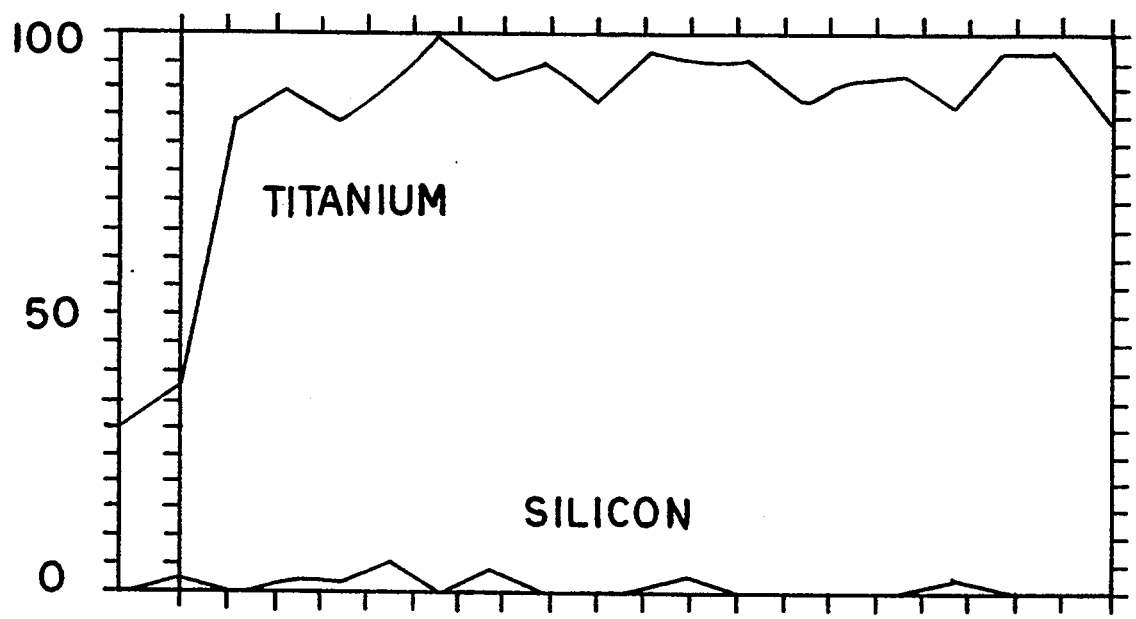

FIG. 3 shows the XPS depth profiles for sample A, before and after the high temperature exposure described above. The profiles start at the surface of the coating layer (depth=0 microns) and proceed into the matrix layer. The top part of FIG. 3 shows the unexposed sample in which a $Ti_5Si_3$ coating is present on a matrix of Ti-6Al-4V. After the high temperature anneal, the coating has completely reacted with the Ti-6Al-4V matrix (bottom of FIG. 3). The titanium level in the coating has risen to that of the matrix and the silicon has completely alloyed with the matrix. This demonstrates that $Ti_5Si_3$ is not an effective protective coating for SiC reinforcements in Ti-alloys.

Figure 4A:
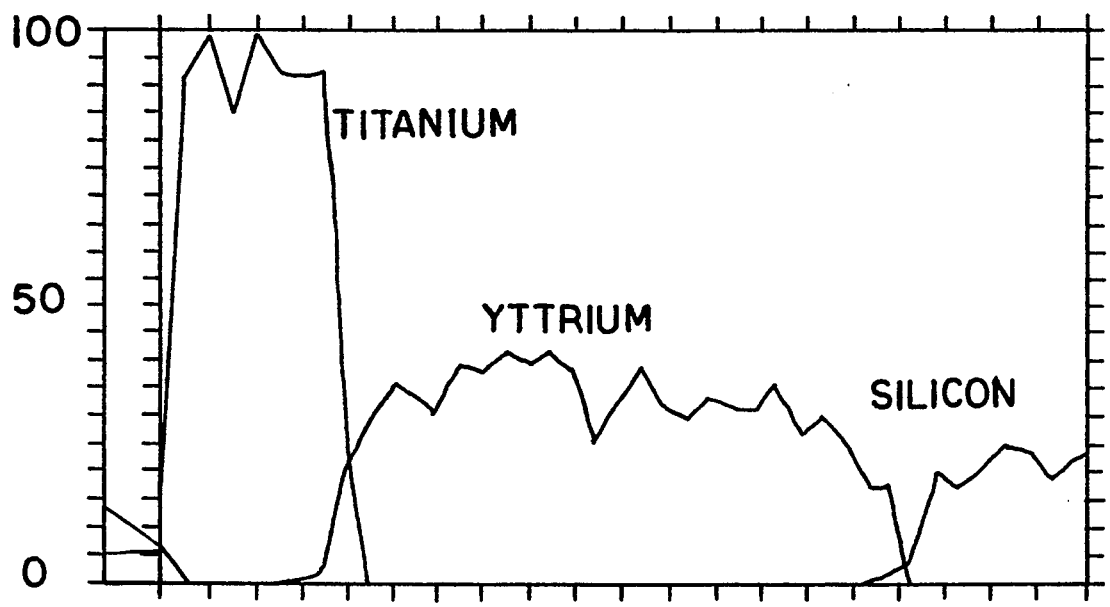
FIG. 4a and 4b are XPS depth profiles for a SiC reinforcement coated with $Y_{0.11}B_{0.89}$ (a) before and (b) after heat treatment at 800° C.
Figure 4B:
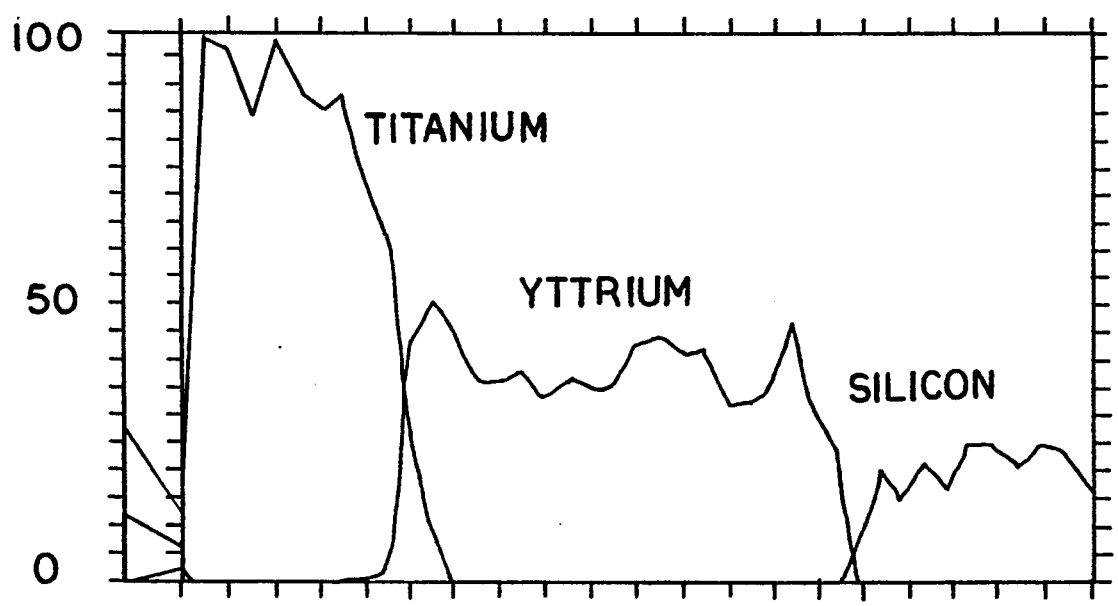

FIG. 4 shows the XPS depth profile for sample H, before and after the high temperature exposure described above. In this case, the profiles start at the surface of the titanium matrix (depth=0 microns) and moves through the $Y_{0.11}B_{0.89}$ coating layer to the SiC reinforcement. The before (top) and after (bottom) profiles are essentially the same. No reaction has occurred and no Ti, Y, or Si diffusion is observed. This demonstrates the stability and effective diffusion barrier properties of the Y-boride coating for SiC reinforcements in Ti-alloys and is representative of rare earth boride coatings for SiC reinforcements in metallic and intermetallic matrices.

To test the stability of the various coatings described above, samples were prepared consisting of matrix, coating and reinforcement. The reinforcement used was SiC. The various coatings and matrices are described in the Table II. The samples were heat treated in vacuum. XPS depth profiles were taken of the samples with and without the heat treatment. Of primary importance to the question of stability of the matrix/coating/SiC-based reinforcement is the diffusion of matrix material, titanium in these examples, from the matrix into the coating. A measure of the effectiveness of the coating is the amount of titanium observed in the middle of the coating layer following the heat treatment. Table III gives the ratio of the Ti in the middle of the coating after the heat treatment to the amount of Ti present in the matrix. Ratios significantly higher than 0 indicate massive diffusion of Ti and failure of the coating to protect the reinforcement from degradation. Ratios near 0.0 indicate excellent performance, minimal or no Ti diffusion, and correspond to stable composite properties. Each sample with the $R_xB_{1-x}$ coating on the reinforcement was found to perform as an effective diffusion barrier in vacuum at high temperature. In Table III, the sample letter designations correspond to those of Table II.

TABLE III

| Sample | Coating | Ti ratio at ½ coating thickness |
| --- | --- | --- |
| 1(F) | $Y_{0.35}B_{0.65}$ | 0.0 |
| 2(G) | $Y_{0.35}B_{0.65}$ | 0.1 |
| 3(H) | $Y_{0.11}B_{0.89}$ | 0.0 |
| 4(I) | none | 1.0 |

The foregoing examples have been presented to demonstrate the oxidation and corrosion resistance of SiC-based reinforcements coated with an $R_xB_{1-x}$ coating as set forth herein in vacuum at high temperatures. These examples are not intended to limit the subject invention, the breadth of which is defined by the specification and the claims appended hereto, but are presented matter to aid those skilled in the art in clearly understanding the invention defined herein.

What we claim is:

1. A coated reinforcement comprising a SiC-based reinforcement having a rare earth boride coating.
2. The coated reinforcement as in claim 1 wherein said coating is represented by the general formula:

$$R_xB_{1-x}$$

wherein
R is selected from the group consisting of Y, Sc, Gd, Tb, Dy, Ho, Er and combinations thereof; and
x is from about 0.05 to about 0.66.

3. The coated reinforcement as in claim 2 wherein said coating further contains up to 20 atomic percent of Si, Al, or combinations thereof.
4. The coated reinforcement as in claim 2 wherein said coating further contains up to 10 atomic percent of N, O, C or combinations thereof.
5. The coated reinforcement as in claim 1 wherein said SiC-based reinforcement is selected from the group consisting of SiC and SiC-based fibers.
6. The coated reinforcement as in claim 1 wherein said SiC-based reinforcement is in the form of continuous fibers.
7. The coated reinforcement as in claim 1 wherein said SiC-based reinforcement is selected from the group consisting of amorphous, polycrystalline and single crystal.
8. The coated reinforcement as in claim 1 wherein said SiC-based reinforcement is pretreated prior to the addition of said coating to said SiC-based reinforcement.
9. The coated reinforcement as in claim 1 wherein said coating is deposited by a thick film deposition process.
10. The coated reinforcement as in claim 1 wherein said coating is deposited by a thin film deposition process.
11. The coated reinforcement as in claim 1 wherein said coating is from about 0.2 microns to about 5.0 microns thick.
12. The coated reinforcement as in claim 1 wherein said coating is from about 0.5 microns to about 2.0 microns thick.
13. The coated reinforcement as in claim 1 wherein said coated reinforcement material is fabricated into a shape.
14. The coated reinforcement as in claim 1 wherein said SiC-based reinforcement material is woven prior to coating.
15. The coated reinforcement as in claim 1 wherein said coated reinforcement material is woven.
16. The coated reinforcement as in claim 1 wherein said SiC-based reinforcement is deposited on a core material.
17. The coated reinforcement as in claim 16 wherein said core material is selected from the group consisting of W, Mo and Ti.
18. The coated reinforcement as in claim 1 wherein said coating has a density of greater than about 80%.
19. The coated reinforcement as in claim 1 wherein said coating has a density of greater than about 95%.
20. A high strength, high temperature performance composite comprising a SiC-based reinforcement having a coating comprising a rare earth boride, said coated reinforcement being disposed in a matrix material.
21. The composite as in claim 20 wherein said coating is represented by the general formula:

$$R_xB_{1-x}$$

wherein
R is selected from the group consisting of Y, Sc, Gd, Tb, Dy, Ho, Er and combinations thereof; and
x is from about 0.05 to about 0.66.

22. The composite as in claim 20 wherein said matrix material contains at least one of Si or Al, and wherein said coating is represented by the general formula $$R_xB_{1-x-y}M_y$$

wherein
R is selected from the group consisting of Y, Sc, Gd, Tb, Dy, Ho, Er and combinations thereof;
M is selected from the group consisting of Si, Al and combinations thereof;
x is from about 0.05 to about 0.66; and
y is greater than zero to about 0.2.

23. The composite as in claim 20 wherein said coating has a density of greater than about 80%.

24. The composite as in claim 20 wherein said coating has a density of greater than about 95%.

25. The composite as in claim 20 wherein said coating is from about 0.2 microns to about 5.0 microns thick.

26. The composite as in claim 20 wherein said coating is from about 0.5 microns to about 2.0 microns thick.

27. The composite as in claim 20 wherein said SiC-based reinforcement is selected from the group consisting of SiC and SiC-based fibers.

28. The composite as in claim 20 wherein said reinforcement material is in the form of continuous fibers.

29. The composite as in claim 20 wherein said reinforcement material is selected from the group consisting of amorphous, polycrystalline and single crystal.

30. The composite as in claim 20 wherein said reinforcement material is pretreated prior to the deposition of said coating.

31. The composite as in claim 20 wherein said coating is deposited by a thick film deposition process.

32. The composite as in claim 20 wherein said coating is deposited by a thin film deposition process.

33. The composite as in claim 20 wherein said matrix material is selected from the group consisting of intermetallic and metallic alloys.

34. The composite as in claim 20 wherein said matrix material is an intermetallic alloy containing at least two of Ti, Al, Nb, Ta, Cr, V and Si.

35. The composite as in claim 20 wherein said matrix material is a metal or alloy containing at least one of Al, Si, Mg, Ni, Ti, Zr, Nb, Ta, Li, V, Sn, Mo, Cr and Mn.

36. The composite as in claim 20 wherein said matrix material is selected from the group consisting of $Ti_3Al$, $TiAl$, $TiAl_3$, $Ti_{44}Nb_{11}Al_{45}$, $TiTaAl_2$, $Ti_{65}Al_{24}Nb_{11}$, $Ni_3Al$, $FeAl$, $NbAl_3$, $Ti$-$6Al$-$4V$, and $Ti$-$15V$-$3Al$-$3Cr$-$3Sn$.

37. The composite as in claim 20 wherein said matrix material comprises a metal or alloy of the group consisting of Ti, Zr, Nb, Ta and combinations thereof.

38. The composite as in claim 20 wherein said matrix material is selected from the group consisting of $Nb_3Al$, $NbAl$, $Zr_3Al$, $ZrAl$, $ZrAl_3$, $Ta_3Al$, $TaAl$, $TaAl_3$, $NiAl$, $Ni_3AlB_{0.01}$, $Fe_3Al$, $Fe_3AlB_{0.01}$, $Ti_5Si_3$, $Zr_5Si_3$, $Al_{67}Ni_8$-$Ti_{25}$, $Ti_{65}V_{10}Al_{25}$, $Ni_2AlTi$, $MoSi_2$, $TiTaAl_{0.8}Cr_{0.1}V_{0.1}$, $TiNbAl_{0.7}V_{0.1}Si_{0.3}$ and $Ti$-$6Al$-$4V$-$1Mo$.

39. The composite as in claim 20 wherein said coating contains up to 10 atomic percent of N, O, C or combinations thereof.

* * * * *